United States Patent
Sugiura

(10) Patent No.: US 10,552,953 B2
(45) Date of Patent: Feb. 4, 2020

(54) MAGNETIC RESONANCE IMAGING APPARATUS

(71) Applicant: Toshiba Medical Systems Corporation, Otawara-shi (JP)

(72) Inventor: Satoshi Sugiura, Otawara (JP)

(73) Assignee: Canon Medical Systems Corporation, Otawara-shi (JP)

(*) Notice: Subject to any disclaimer, the term of this patent is extended or adjusted under 35 U.S.C. 154(b) by 0 days.

(21) Appl. No.: 15/375,865

(22) Filed: Dec. 12, 2016

(65) Prior Publication Data
US 2017/0178319 A1 Jun. 22, 2017

(30) Foreign Application Priority Data
Dec. 21, 2015 (JP) .................. 2015-248486

(51) Int. Cl.
*G06K 9/00* (2006.01)
*G06T 7/00* (2017.01)
*G06F 3/0484* (2013.01)

(52) U.S. Cl.
CPC ........ *G06T 7/0012* (2013.01); *G06F 3/04847* (2013.01); *G06T 2207/10088* (2013.01)

(58) Field of Classification Search
CPC ..... A61B 5/055; A61B 5/0037; A61B 5/0042; A61B 5/7214; A61B 5/7445; G01R 33/5602; G01R 33/4835; G01R 33/4838; G01R 33/50; G01R 33/5608; G01R 33/5615; G01R 33/5616; G01R 33/5617;
(Continued)

(56) References Cited

U.S. PATENT DOCUMENTS 8,204,290 B2* 6/2012 Haras ............... A61B 6/032
382/131
8,874,189 B2 10/2014 Warntjes
(Continued)

FOREIGN PATENT DOCUMENTS

| JP | 62-64348 A | 3/1987 |
|---|---|---|
| JP | 63-194649 A | 8/1988 |
| JP | 2008-307303 A | 12/2008 |

OTHER PUBLICATIONS

Dan Ma et al. "Magnetic resonance fingerprinting," Nature, vol. 495, Mar. 14, 2013, pp. 6.
(Continued)

*Primary Examiner* — Bhavesh M Mehta
*Assistant Examiner* — Ian L Lemieux
(74) *Attorney, Agent, or Firm* — Oblon, McClelland, Maier & Neustadt, L.L.P.

(57) ABSTRACT

A magnetic resonance imaging apparatus includes processing circuitry. The processing circuitry performs first imaging to acquire multiple magnetic resonance signals that are used to derive a quantitative value of tissue. The processing circuitry derives a quantitative value of tissue on the basis of the multiple magnetic resonance signals. The processing circuitry displays, on a display, an estimated image obtained by estimating, through a calculation, an image to be obtained by performing second imaging different from the first imaging on the basis of the derived quantitative value of tissue. The processing circuitry acquires an image by performing the second imaging in which an imaging parameter corresponding to the estimated image is set.

10 Claims, 9 Drawing Sheets

(58) Field of Classification Search
CPC ......... G06T 7/0012; G06T 2207/10088; G06F 3/04847
See application file for complete search history.

(56) References Cited

U.S. PATENT DOCUMENTS

| | | | |
|---|---|---|---|
| 9,041,393 B2 | 5/2015 | Warntjes | |
| 2003/0092981 A1* | 5/2003 | Deimling | A61B 5/055 600/410 |
| 2003/0105605 A1* | 6/2003 | Degani | G06T 7/0012 702/104 |
| 2007/0241753 A1* | 10/2007 | Sodickson | A61B 5/0536 324/307 |
| 2018/0140218 A1* | 5/2018 | Heberlein | G01R 33/543 |
| 2018/0353151 A1* | 12/2018 | Tang | A61B 6/545 |

OTHER PUBLICATIONS

Robert C. Lange et al. "An Evaluation of MRI Contrast in the Uterus Using Synthetic Imaging," Magnetic Resonance in Medicine 17, 1991, pp. 6.
Japanese Office Action dated Sep. 3, 2019, in Patent Application No. 2015-248486, 3 pages.

\* cited by examiner

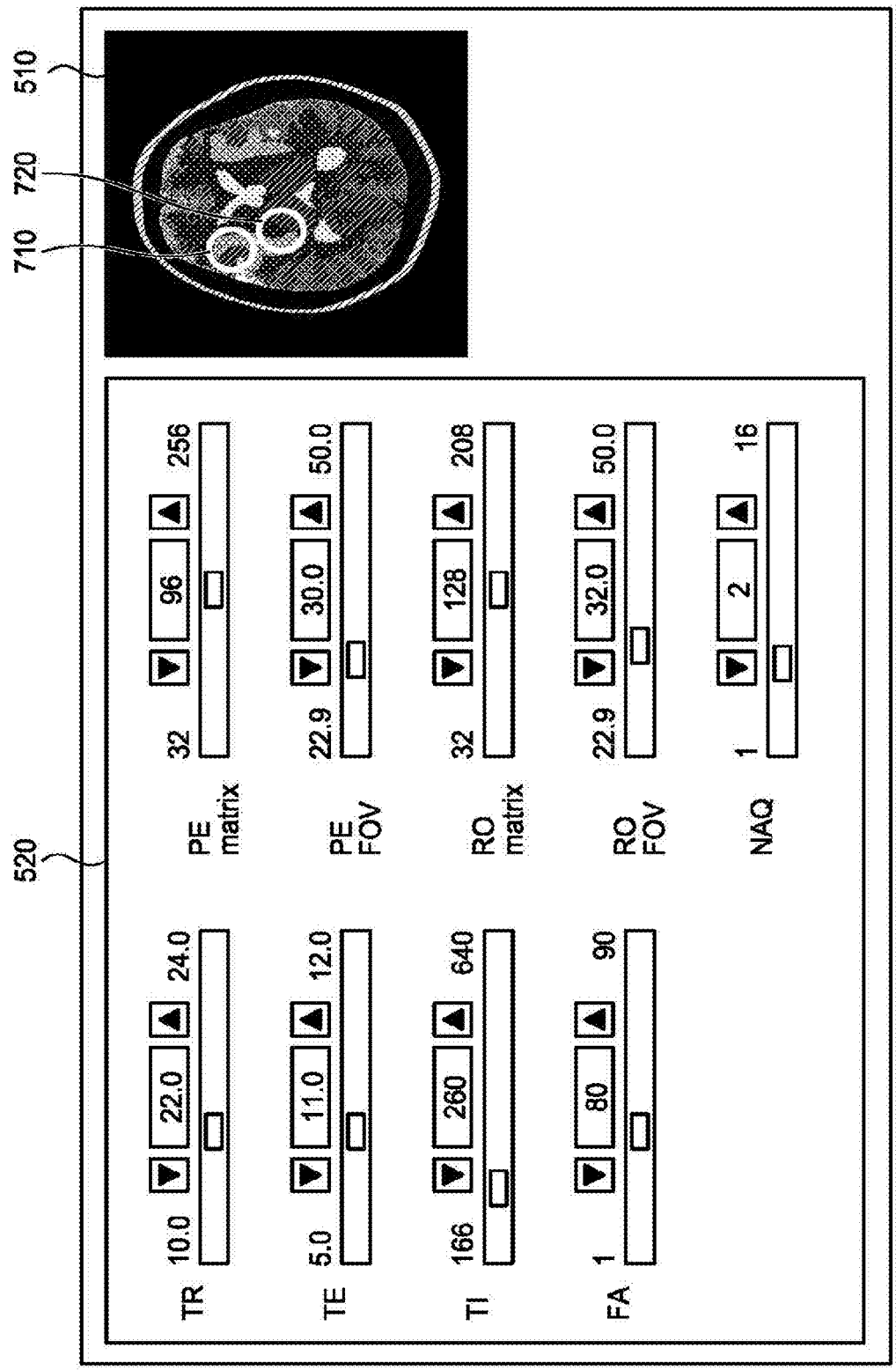

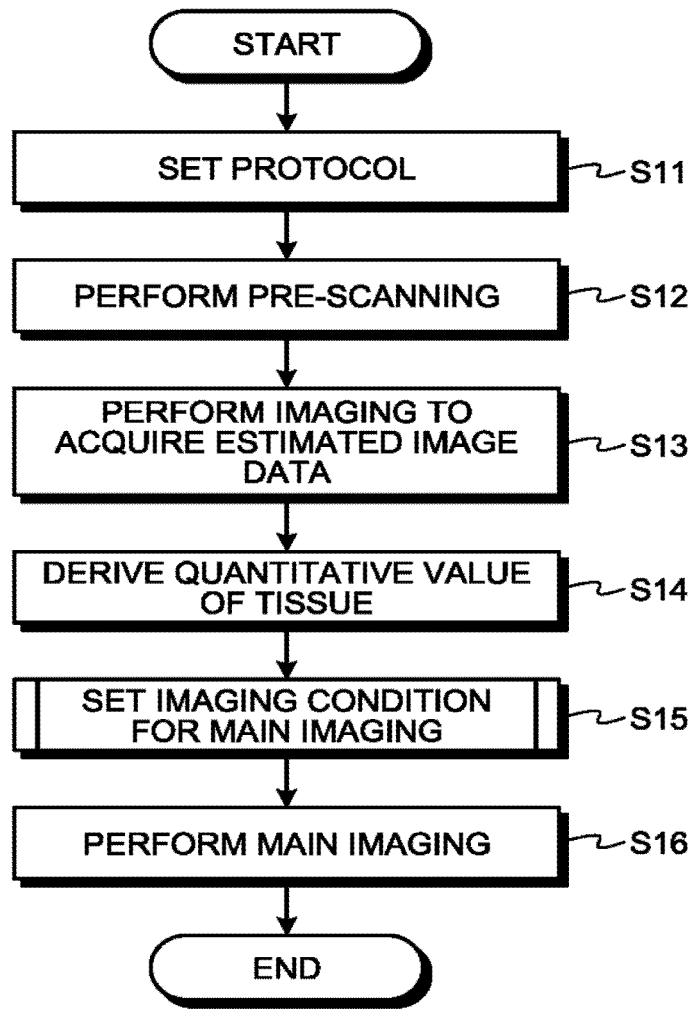

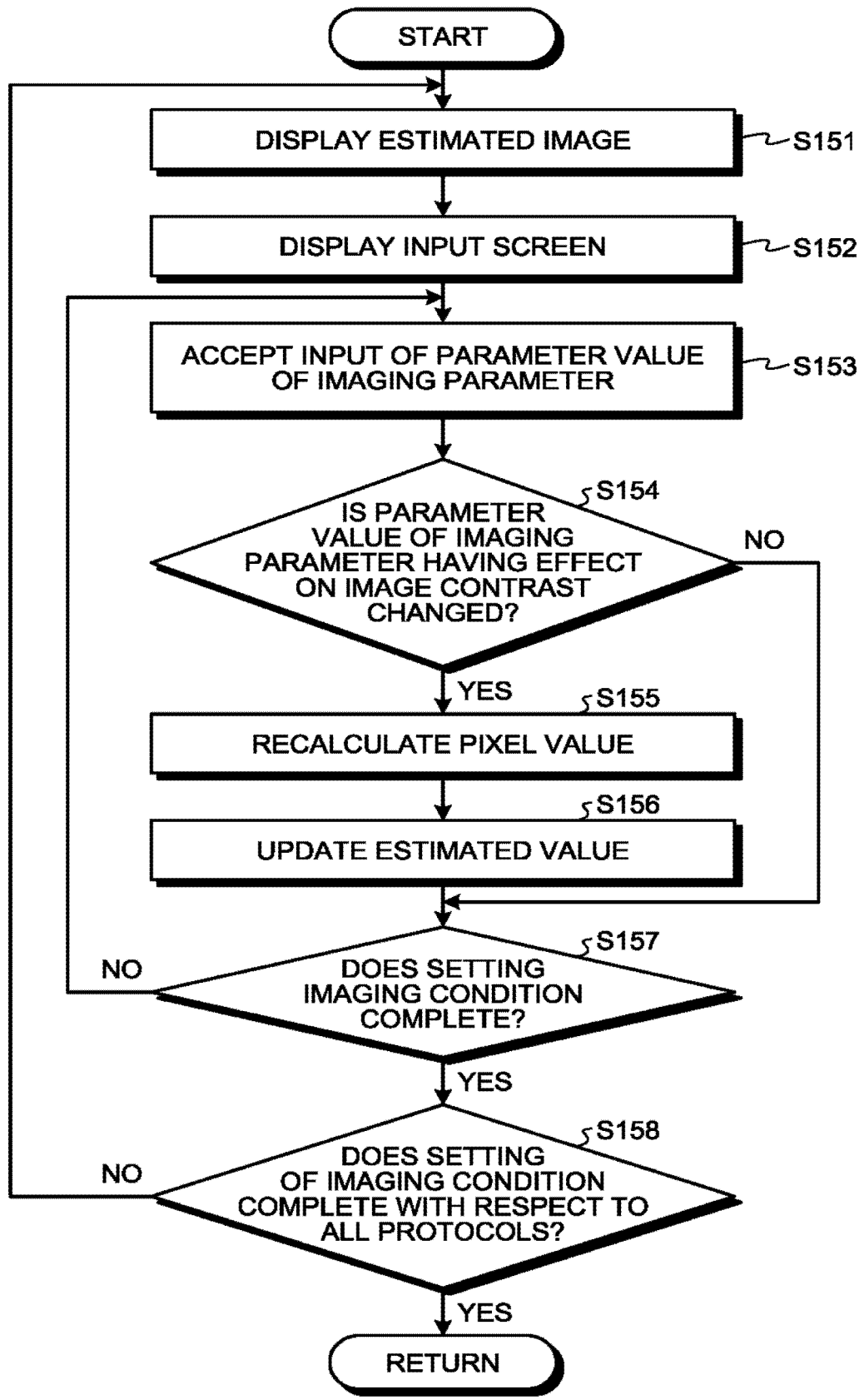

MAGNETIC RESONANCE IMAGING APPARATUS

CROSS-REFERENCE TO RELATED APPLICATIONS

This application is based upon and claims the benefit of priority from Japanese Patent Application No. 2015-248466, filed on Dec. 21, 2015; the entire contents of which are incorporated herein by reference.

FIELD

Embodiments described herein relate generally to a magnetic resonance imaging apparatus.

BACKGROUND

A magnetic resonance imaging (MRI) apparatus is an apparatus that acquires chemical and physical microscopic information on a substance by utilizing a magnetic resonance phenomenon. The magnetic resonance phenomenon is a phenomenon that, when a group of subject nuclear spins is placed in a magnetic field, the nuclear spins resonate with a radio frequency magnetic field that rotates at a certain frequency (referred to as a resonance frequency) corresponding to the unique magnetic moment of the nuclear spins and the intensity of a magnetic field in which the nuclear spins exist and accordingly a signal (referred to as a magnetic resonance signal) is generated in a relaxation process of the nuclear spins. In the MRI apparatus, adjusting the parameter values of imaging parameters that define pulse sequences that are used for imaging makes it possible to obtain images having various contrasts reflecting, for example, T1 and T2 that are relaxation times of tissue and the density of hydrogen nuclei (proton density).

Normally, in diagnosing with an MRI apparatus, a limited number of T1-weighted image and a T2-weighted image are obtained due to considerations of the examination time according to pre-set certain imaging parameters and then a diagnosis is made. Depending on the clinical condition, however, there may be a unique imaging parameter that enables not a pre-determined contrast image but the easiest identification of a lesion. Under the circumstances, there is a technology in which an MRI apparatus calculates, with respect to each pixel, for example, relaxation time, a density of hydrogen nuclei, and a strength of a radio frequency magnetic field from multiple sets of image data obtained from a subject and creates, through a calculation, an image in which the degree of T1 weighting and T2 weighting is changed after imaging.

BRIEF DESCRIPTION OF THE DRAWINGS

FIG. 7 is a diagram of an exemplary estimated image and an exemplary input screen that are displayed by a display control function according to a third embodiment;

FIG. 8 is a flowchart of a procedure of a process performed by an MRI apparatus according to a fourth embodiment; and FIG. 9 is a flowchart of a procedure of the process of setting an imaging condition for main imaging illustrated in FIG. 6.

DETAILED DESCRIPTION

An MRI apparatus according to an embodiment includes processing circuitry. The processing circuitry is configured to perform first imaging to acquire multiple magnetic resonance signals used to derive a quantitative value of tissue. The processing circuitry derives a quantitative value of tissue on the basis of the multiple magnetic resonance signals. The processing circuitry displays, on a display, an estimated image obtained by estimating, through a calculation, an image to be obtained by performing second imaging different from the first imaging on the basis of the derived quantitative value of tissue. The processing circuitry acquires an image by performing the second imaging in which an imaging parameter corresponding to the estimated image is set.

First Embodiment

Figure 1:
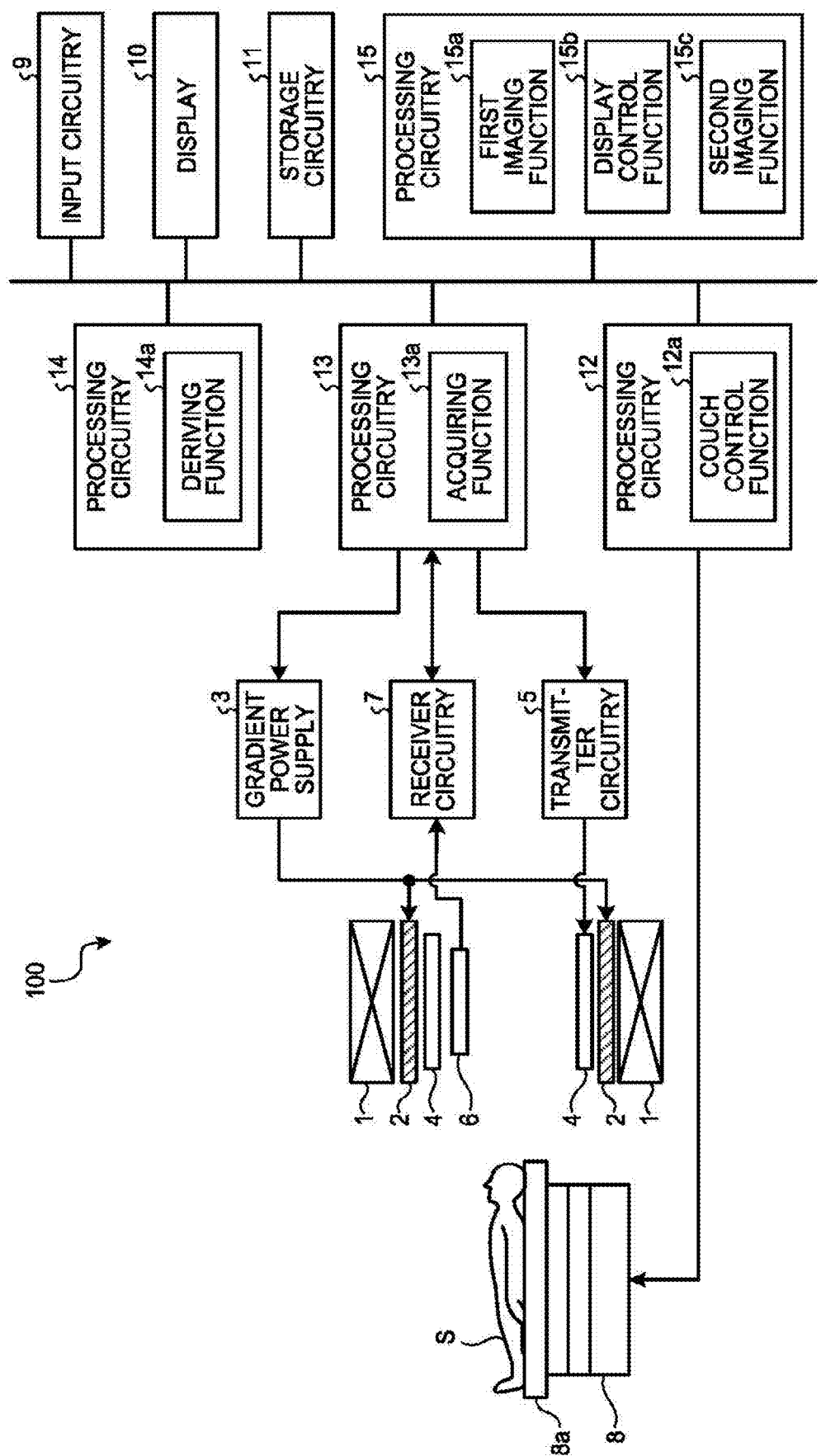
FIG. 1 is a diagram of an exemplary configuration of an MRI apparatus according to a first embodiment.

FIG. 1 is a diagram of an exemplary configuration of an MRI apparatus 100 according to a first embodiment. For example, as shown in FIG. 1, the MRI apparatus 100 includes a static magnetic field magnet 1, a gradient coil 2, a gradient power supply 3, a transmitter coil 4, a transmitter circuitry 5, a receiver coil 6, a receiver circuitry 7, a couch 8, an input circuitry 9, a display 10, a storage circuitry 11, and processing circuitries 12 to 15.

The static magnetic field magnet 1 is formed into a hollow and approximately cylindrical shape (including one whose cross-section orthogonal to the center axis of the cylinder elliptic) and generates a uniform static magnetic field in an imaging space that is formed on the side of the inner circumference. For example, the static magnetic field magnet 2 is implemented with, for example, a permanent magnet or a superconducting magnet.

The gradient coil 2 is formed into a hollow and approximately cylindrical shape (including one whose cross-section orthogonal to the center axis of the cylinder is elliptic) and is arranged on the side of the inner circumference of the static magnetic field magnet 1. The gradient coil 2 includes three coils that generate gradient magnetic fields respectively along x, y and z axes that are orthogonal to one another. The x, y and z axes constitute an apparatus coordinate system unique to the MRI apparatus 100. For example, the direction of the x-axis is set in the horizontal direction and the y-axis direction is set in the vertical direction. Furthermore, the z-axis direction is set in the same direction as the direction of a magnetic flux of the static magnetic field that is generated by the static magnetic field magnet 1.

The gradient power supply 3 supplies an electric current individually to each of the three coils of the gradient coil 2 to cause gradient magnetic fields along the x, y and x axes, respectively, in the imaging space. Generation of the gradient magnetic fields along the x, y and z axes, respectively, enables generation of gradient magnetic fields respectively along a read-out direction, a phase encoding direction, and a slice direction. The axes respectively along the read-out direction, the phase encoding direction, and the slice direction constitute a logical coordinate system for defining a slice area or a volume area to be imaged. The gradient magnetic field along the read-out direction will be referred to as a read-out gradient magnetic field, the gradient magnetic field along the phase encoding direction will be referred to as a phase encoding gradient magnetic field, and a gradient magnetic field along the slice direction will be referred to as a slice gradient magnetic field.

Each of the gradient magnetic fields overlaps the static magnetic field that is generated by the static magnetic field magnet and is used to provide spatial positional information to a magnetic resonance (MR) signal. Specifically, changing the frequency of an MR signal according to the position in the read-out direction enables the read-out gradient magnetic field to provide positional information along the read-out direction to the MR signal. Furthermore, changing the phase of the MR signal along the phase encoding direction enables the phase encoding gradient magnetic field to provide information on the position in the phase encoding direction to the MR signal. Furthermore, when the imaging area is the slice area, the slice gradient magnetic field is used to determine the direction and thickness of the slice area. When the imaging area is the volume area, changing the phase of the MR signal according to the position in the slice direction enables provision of information on the position along the slice direction to the MR signal.

The transmitter coil 4 is formed into a hollow and approximately cylindrical shape (including one whose cross-section orthogonal to the center axis of the cylinder is elliptic) and is arranged on the inner side with respect to the gradient coil 2. The transmitter coil 4 applies a radio frequency (RF) pulse that is output from the transmission circuitry 5 to the imaging space.

The transmitter circuitry 5 outputs an RE pulse corresponding to the Larmor frequency to the transmitter coil 4. For example, the transmitter circuitry 5 includes an oscillation circuitry, a phase selecting circuitry, a frequency converting circuitry, an amplitude modulating circuitry, and an RF amplifying circuitry. The oscillation circuitry generates an RE pulse of a resonance frequency unique to the target nuclei placed in the static magnetic field. The phase selecting circuitry selects a phase of the RF pulse to be output from the oscillation circuitry. The frequency converting circuitry converts the frequency of the RF pulse that is output from the phase selecting circuitry. The amplitude modulating circuitry modulates the amplitude of the RF pulse that is output from the frequency modulating circuitry according to, for example, a sine function. The RF amplifying circuitry amplifies the RF pulse that is output from the amplification modulating circuitry and outputs the amplified RF pulse to the transmitter coil 4.

The receiver coil 6 is an RF coil that receives an MR signal that is emitted from the subject S. Specifically, the receiver coil 6 is an RF coil that is worn by the subject who is placed in the imaging space and receives the MR signal that is emitted from the subject S because of the effect of the RF magnetic field that is applied by the transmitter coil 4. The receiver coil 6 outputs the received MR signal to the receiver circuitry 7. For example, a dedicated coil is used as the receiver coil 6 for each region to be imaged. The dedicated coil may be, for example, a receiver coil for head, a receiver coil for cervix, a receiver coil for shoulder, a receiver coil for breast, a receiver coil for abdomen, a receiver coil for lower extremity, a receiver coil for spine.

The receiver circuitry 7 generates MR signal data on the basis of the MR signal that is output from the receiver coil 6 and outputs the generated MR signal data to the processing circuitry 13. For example, the receiver circuitry 7 includes a selecting circuitry, a former amplifying circuitry, a phase detection circuitry, and an analog-digital conversion circuitry. The selecting circuitry selectively inputs the MR signal that is output from the receiver coil 6. The former amplifying circuitry amplifies the MR signal that is output from the selecting circuitry. The phase detecting circuitry detects the phase of the MR signal that is output from the former amplifying circuitry. The analog-digital conversion circuitry converts the analog signal that is output from the phase detection circuitry into a digital signal to generate MR signal data (raw data) and outputs the generated MR signal data to the processing circuitry 13.

An exemplary case where the transmitter coil 4 applies an RE pulse and the receiver coil 6 receives an MR signal will be described here; however, modes of the transmitter coil and the receiver coil are not limited to this. For example, the transmitter coil 4 may further include a receiving function that receives an MR signal. The receiver coil 6 may further include a transmitting function that applies a RF magnetic field. When the transmitter coil 4 includes the receiving function, the receiver circuitry 7 generates MR signal data also from the MR signal that is received by the transmitter coil 4. When the receiver coil 6 includes the transmitting function, the transmitter circuitry 5 outputs an RE pulse also to the receiver coil 6.

The couch 8 includes a couchtop 8a on which the subject S is placed. When the subject S is imaged, the couchtop 6a is inserted into the imaging space that is formed on the inner side with respect to the static magnetic field magnet 1 and the gradient coil 2. For example, the couch 8 is set such that its longitudinal direction is parallel with the center axis of the static magnetic field magnet 1.

The input circuitry 9 accepts an operation of inputting various instructions and various types of information from an operator. For example, the input circuitry 9 is implemented with, for example, a trackball, a switch button, a mouse, a keyboard, or a touch panel. Specifically, the input circuitry 9 is connected to the processing circuitry 15, and the input circuitry 9 converts input operations accepted from the operator into electric signals and outputs the electric signals to the processing circuitry 15.

The display 10 displays various types of information. For example, the display 10 is implemented with, for example, a liquid crystal monitor, a cathode ray tube (CRT), or a touch panel. Specifically, the display 10 is connected to the processing circuitry 15, and the display 10 converts various types of information transmitted from the processing circuitry 15 into electric signals for display and outputs the electric signals. For example, the display 10 displays a graphical user interface (GUI) for accepting various instructions and an operation of inputting various types of information from the operator and various types of information, such as spectrum data and image data.

The storage circuitry 11 stores various types of data. For example, the storage circuitry 11 is implemented with, for example, a semiconductor memory device, such as a random access memory (R a flash memory, a hard disk, or an optical disk. Specifically, the storage circuitry 11 stores, for example, MR signal data, spectrum data, and image data with respect to each subject S.

The processing circuitry 12 controls operations of the couch 8. For example, the processing circuitry 12 is implemented with a processor. For example, the processing circuitry 12 includes a couch control function 12a. The couch control function 12a is connected to the couch 8 and outputs electric signals for control to the couch 8 to control operations of the couch 8. For example, the couch control function 12a accepts an instruction to move the couchtop 8a in the longitudinal direction, in the vertical direction, or rightward and leftward from the operator via the input circuitry 9 and runs the driver mechanism of the couchtop 8a of the couch 8 to move the couchtop 8a according to the accepted instruction.

The processing circuitry 13 executes various pulse sequences to acquire MR signal data on the subject S. For example, the processing circuitry 13 is implemented with a processor. For example, the processing circuitry 13 includes an acquiring function 13a. The acquiring function 13a executes the various pulse sequences according to the imaging condition that is set by the operator. Specifically, the acquiring function 13a executes the various pulse sequences by driving the gradient power supply 3, the transmitter circuitry 5, and the receiver circuitry 7 on the basis of pulse sequence execution data that is transmitted from the processing circuitry 15.

The pulse sequence execution data is information that defines pulse sequences representing procedures for acquiring MR signal data. Specifically, the pulse sequence execution data is information that defines, for example, timings at each of which the gradient power supply 3 supplies an electric current to the gradient coil 2, intensities of electric currents to be supplied, intensities of RE pulse currents to be supplied by the transmitter circuitry 5 to the transmitter coil 4, timings of the supplies, and detection timings at each of which the receiver circuitry 7 detects an MR signal.

The acquiring function 13a receives MR signal data from the receiver circuitry 7 as a result of execution of the various pulse sequences and stores the received MR signal data in the storage circuitry 11. An assembly of sets of MR signal data received by the acquiring function 13a is arrayed two-dimensionally or three-dimensionally according to the positional information that is provided by the read-out gradient filed, the phase encoding gradient filed, and the slice gradient field, which are described above, and is thus stored in the storage circuitry 11 as data configuring the space.

The processing circuitry 14 performs various types of data processing on the basis of the MR signals that are acquired from the subject S. For example, the processing circuitry 14 is implemented with a processor. For example, on the basis of the MR signal data acquired by the acquiring function 13a of the processing circuitry 13, the processing circuitry 14 generates spectrum data or image data on desired nuclear spins in the subject S. Specifically, the processing circuitry 14 reads the MR signal data acquired by the acquiring function 13a from the storage circuitry 11 and performs post processing, i.e., a reconstruction process, such as Fourier transform, on the read MR signal data to generate spectrum data or image data. The processing circuitry 14 further stores the generated image data in the storage circuitry 11.

The processing circuitry 15 controls each component of the MRI apparatus 100 to control the entire MRI apparatus 100. For example, the processing circuitry 15 is implemented with a processor. For example, the processing circuitry 15 accepts inputs of various imaging parameters of pulse sequences from the operator via the input circuitry 9 and generates pulse sequence execution data on the basis of the accepted imaging parameters. The processing circuitry 15 transmits the generated pulse sequence execution data to the processing circuitry 14 to execute the various pulse sequences.

The exemplary configuration of the MRI apparatus 100 according to the first embodiment has been described. The MRI apparatus configured as described above is able to obtain images having various contrasts each reflecting, for example, T1 and T2 that are relaxation times of tissue and the density of hydrogen nuclei by adjusting the parameter values of the imaging parameters that define the pulse sequences used for imaging.

Normally, in diagnosing with an MRI apparatus, a limited number of T1-weighted image and a T2-weighted image are obtained due to considerations of the examination time according to pre-set certain imaging parameters and then a diagnosis is made. Depending on the clinical condition, however, there may be a unique imaging parameter that enables not a pre-determined contrast image but the easiest identification of a lesion. In this case, for example, additional imaging in which the degree of the weighting is changed is performed by adjusting the parameter values of the imaging parameters, which increases the total examination time. Because the degree of weighting the T1 relaxation time and the T2 relaxation time varies depending on the combination of multiple imaging parameters, such as a repetition time (TR), an echo time (TB), an inversion time (TI), and a flip angle (FA), it is not easy to adjust the parameter values. Furthermore, in many cases, whether an obtained image has a desired contrast is not known unless imaging is performed.

Under the circumstances, there is a technology in which an MRI apparatus calculates, with respect to each pixel, for example, relaxation time, a density of hydrogen nuclei, and an intensity of a radio frequency magnetic field from multiple sets of image data obtained from a subject and creates, through a calculation, an image in which the degree of T1 weighting and T2 weighting is changed after imaging. For example, there is a technology in which the T2 value of tissue is calculated through a calculation from the images captured according to multiple TEs and the T1 value of tissue is calculated from the images captured according to multiple TIs. If it is possible to calculate local B1 field strength from the images acquired according to the multiple FAs, it is possible to correct the effect of inhomogeneity in the B1 field strength on the calculated image.

The technology of creating such a calculated image enables generation of an image having any contrast from multiple sets of image data obtained by performing imaging while changing the imaging parameters, such as TE, TI and FA, having effects on the contrast after the imaging. For this reason, this technology makes it possible to observe, in an optimum contrast, even a lesion that is difficult to depict in an image having a pre-set fixed contrast without performing additional imaging.

This technique however uses multiple sets of image data obtained while TE and TI are changed and therefore, when the same spatial resolution and the same number of slices are used, an imaging time longer than that for a normal T1-weighted image or T2 weighted image is required normally. Accordingly, when an image having a large matrix size, i.e., an image having a high spatial resolution, a three-dimensional image (volume data) having a large number of slices, an image having a high SN ratio obtained while the number of acquisition is increased, or an image of a combination of those images, it is difficult to obtain the image without lowering the image quality, such as the SN ratio.

Under the circumstances, the MRI apparatus 100 according to the first embodiment includes a function for enabling acquisition of a more proper image according to the clinical condition. For example, the processing circuitry 14 includes a deriving function 14a. Furthermore, for example, the processing circuitry 15 includes a first imaging function 15a, a display control function 15b, and a second imaging function 15c.

The first imaging function 15a performs first imaging to acquire multiple magnetic resonance signals used to derive quantitative values of tissues. For example, the first imaging function 15a performs, as the first imaging, imaging to acquire images having a resolution lower than that of images acquired by performing second imaging.

The deriving function 14a derives quantitative values of tissues on the basis of the acquired multiple magnetic resonance signals. The quantitative value of tissue is a value representing characteristics of tissue. For example, the quantitative value of tissue is a value, such as a longitudinal relaxation time (T1), a transverse relaxation time (T2), a proton density (PD), a radio frequency magnetic field (B1) strength, an apparent diffusion coefficient (ADC), T2*, T1ρ or T2ρ.

The display control function 15b displays, on the display 10, an estimated image obtained by estimating, through a calculation, images to be obtained by performing second imaging different from the first imaging on the basis of the derived quantitative values of tissues. The display control function 15b displays, on the display 10, an input screen that accepts inputs of parameter values of imaging parameters together with the estimated image and, when an input parameter is changed, updates the displayed estimated image through a recalculation. For example, the display control function 15b displays an imaging parameter having an effect on the contrast of the image on the input screen and accepts an input of a parameter value of the imaging parameter. For example, the display control function 15b limits the range of input value of the imaging parameter displayed on the input screen. For example, the display control function 15b limits the range of the input value according to at least one of the performance of the apparatus, the subject, and another imaging parameter.

The second imaging function 15c acquires images by performing the second imaging in which the imaging parameters corresponding to the displayed estimated image are set.

The processing circuitries 14 and 15 are an example of the processing circuitry according to the claims.

Each function of the above-described processing circuitries 14 and 15 will be described in detail below.

Figure 2:
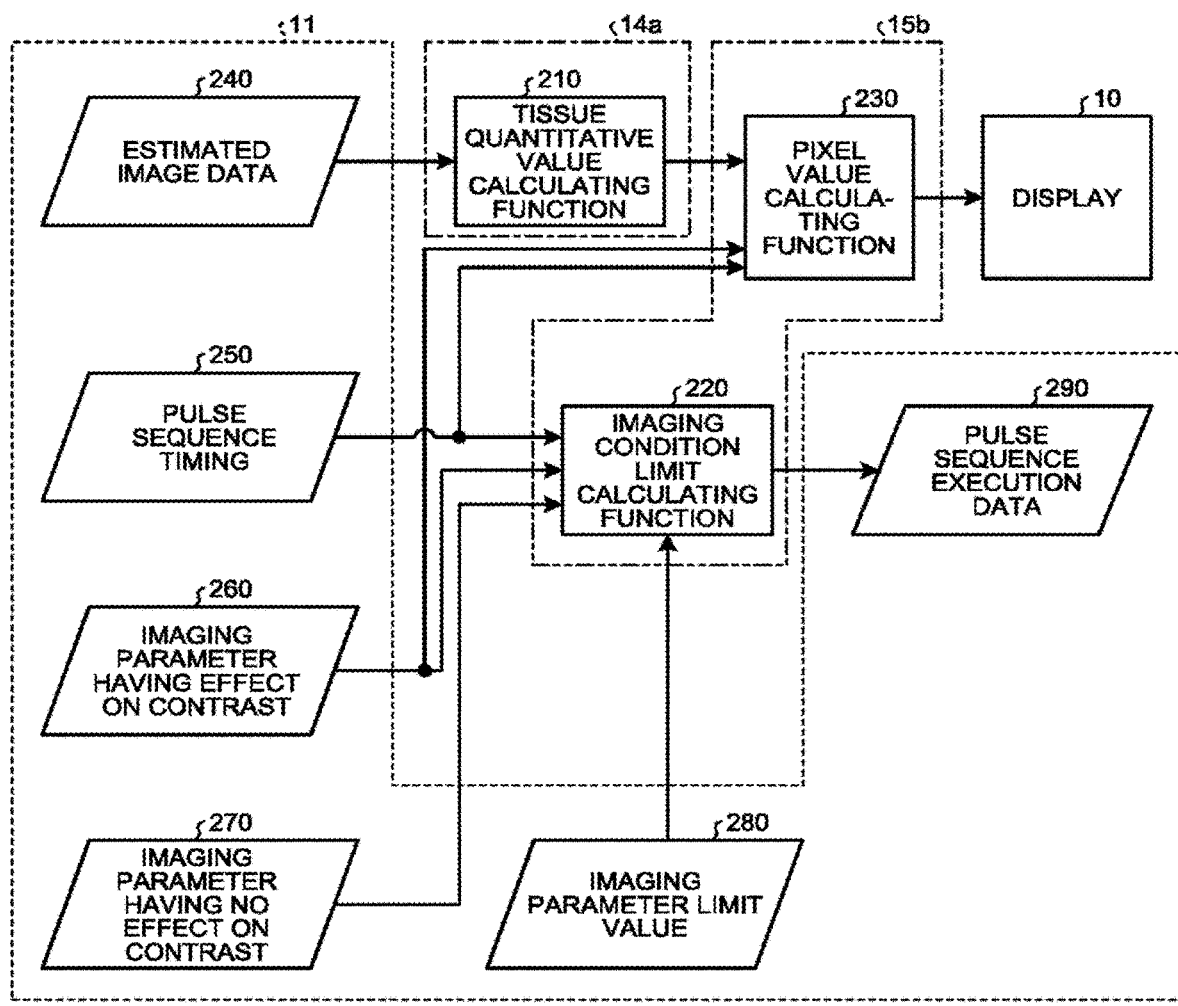
FIG. 2 is a diagram illustrating details of a deriving function and a display control function represented in FIG. 1.

FIG. 2 is a diagram illustrating details of the deriving function 14a and the display control function 15b represented in FIG. 1. For example, as illustrated in FIG. 2, the deriving function 14a includes a tissue quantitative value calculating function 210. The display control function 15b includes an imaging condition limit calculating function 220 and a pixel value calculating function 230.

For example, data for estimated image 240, a pulse sequence timing 252, an imaging parameter 222 having an effect on the contrast, an imaging parameter 270 having no effect on the contrast, an imaging parameter limit value 280, and pulse sequence execution data 290 are stored in the storage circuitry 11.

The data for estimated image 240 is multiple sets of image data on a subject obtained by performing imaging while changing some of the imaging parameters having effects on the image contrast or MR signal data. The data for estimated image 240 is acquired by the first imaging function 15a to be described below by performing imaging to acquire the multiple sets of data for estimated image 240 and is stored in the storage circuitry 11.

Imaging to acquire the data for estimated image 240 is, for example, imaging to acquire multiple sets of image data obtained by performing imaging while changing an imaging parameter having an effect on the contrast. This imaging to acquire the data for estimated image 240 is, for example, performed prior to main imaging to acquire images used for a diagnosis. The main imaging is, for example, high-resolution imaging, three-dimensional imaging, or a combination of high-resolution imaging and three-dimensional imaging. The imaging to acquire the data for estimated image 240 is an example of the above-described first imaging and the main imaging is an example of the above-described second imaging.

The tissue quantitative value calculating function 212 uses the data for estimated image 240 to calculate, for example, T1, T2, BF, B1 field strength, and ADC with respect to each pixel. For example, the tissue quantitative value calculating function 210 calculates a quantitative value of tissue by using the method described in, for example, U.S. Pat. No. 9,041,393.

The pulse sequence of the main imaging is defined by the pulse sequence timing 250, the imaging parameter 260 having an effect on the contrast, and the imaging parameter 270 having no effect on the contrast. For example, defaults of the pulse sequence timing 250, the imaging parameter 260 having an effect on the contrast, and the imaging parameter 270 having no effect on the contrast are set in advance and the defaults are stored in the storage circuitry 11.

It is possible to use, as the pulse sequence of the main imaging, a sequence of, for example, HP-RAGE that is an inversion recovery method utilizing segmentation and enabling relatively-high speed acquisition of three-dimensional data or a three-dimensional fast spin echo based sequence. MP-RAGE is suitable for T1-weighted imaging and the three-dimensional fast spin echo based sequence is often used for T2-weighted imaging. The pulse sequence of the main imaging may be of a type different from that of the pulse sequence of the imaging to acquire the data for estimated image 240.

The pulse sequence timing 250 includes timings at which RF pulses are applied in the main imaging and timings at which data are acquired. The imaging parameters are categorized into two types. Specifically, the imaging parameters are classified into the imaging parameter 260 having an effect on the contrast and the imaging parameter 270 having no effect on the contrast.

The imaging parameter 260 having an effect on the contrast includes, for example, TR, IF, TI, FA, and b-value representing the intensity of a motion probing gradient (MPG) pulse used for diffusion-weighted imaging. The imaging parameter 270 having no effect on the contrast includes, example, a field of view (FOV), a matrix size, a slice thickness, the number of slices, and the number of acquisitions (NAQ).

The imaging parameter limit value 260 is limit values of the maximum and minimum values that can be set with respect to each imaging parameter. The limit values are determined from, for example, the performance unique to the apparatus, such as a maximum strength of gradient magnetic field, a slew rate, and a specific absorption rate (SAR) that is determined from the RF level and the weight of patient that are a requirement unique to the subject, and furthermore the imaging parameters have mutual effects thus are limited within a given range.

As exemplary limitation on the minimum value, for example, there is an extension of the settable shortest TE with a reduction in the slice thickness or an extension of the settable shortest TR with an increase in FA. A default of the imaging parameter limit value 280 is set in advance and the default is stored in the storage circuitry 11. When the parameter value of each imaging parameter is changed, the imaging condition limit calculating function 220 actively recalculates and updates the imaging parameter limit value 280.

The imaging condition limit calculating function 220 generates the pulse sequence execution data 290 on the basis of the set parameter value of the imaging parameter and stores the pulse sequence execution data 290 in the storage circuitry 11. The pulse sequence execution data 290 stored in the storage circuitry 11 is read by the second imaging function 15c to be described below and is used to execute the pulse sequence of the main imaging.

The pulse sequence execution data 290 consists of the amplitudes and waveforms of varying points of gradient pulses of the respective x, v and z axes at each time, the waveforms, amplitudes and phases of RF pulses, timings at which the RF pulses are applied, sampling interval of A/D conversion, sampling points, and timing, which are data over time for controlling the gradient power supply 3, the transmitter circuitry 5, and the receiver circuitry 7.

The pixel value calculating function 230 creates, through a calculation, an estimated image of the subject on the basis of the quantitative value of tissue, which is calculated by the tissue quantitative value calculating function 210, the pulse sequence timing 250 of the main imaging, and the imaging parameter 260 having an effect on the contrast. The estimated image is a calculated image. The pixel value calculating function 230 displays the generated estimated image on the display 10.

On the basis of the relaxation time and the B1 field strength of each pixel, the timing at which the RF pulse is applied, FA, and the timing at which the signal is received, the pixel value calculating function 230 calculates a signal intensity at a time at which the signal is received. Accordingly, the pixel value calculating function 230 is able to generate an image corresponding to the contrast obtained when the pulse sequence corresponding to the provided imaging parameter is executed.

For example, when the operator changes the imaging parameter 260 having an effect on the image contrast via the input circuitry 9 when editing the imaging condition for the main imaging, the pixel value calculating function 230 creates an estimated image again by using the changed imaging parameter. The pixel value calculating function 230 then displays the re-created estimated image on the display 10.

The pixel value calculating function 230 displays and updates the displayed estimated image in this manner and accordingly, when the main imaging is performed according to the input parameter value of the imaging parameter, the operator is able to determine whether the image to be obtained by performing the main imaging has a contrast suitable to diagnose the lesion.

For example, assume that IF is changed as an imaging parameter having an effect on the contrast. When the operator looks at the estimated image displayed on the display 10 and wants to observe the tissue with a short T2 more finely, the operator tries to shorten the TE from the set value at that time. The lowest value of TE is limited by, for example, the spatial resolution or the slice thickness that are set at that time. In this case, by relaxing FOV, the matrix size, or the slice thickness, the operator is able to shorten settable TE. This control is performed by the imaging condition limit calculating function 220. Accordingly, the operator is able to set the contrast optimally within the range assuring execution of the main imaging with respect to the performance of the apparatus, safety and the relevance with other imaging parameters.

Each processing function of the processing circuitries 12 to 15 is stored in the storage circuitry 11, for example, in a form of a computer-executable program. Each processing circuitry reads each program from the storage circuitry 11 and executes the read program to implement the processing function corresponding to each program. In other words, the processing circuitries 12 to 15 having read the respective programs have the respective functions illustrated in FIG. 1.

FIG. 1 exemplifies the case where the processing function of the processing circuitry 12, the processing function of the processing circuitry 13, the processing function of the processing circuitry 14, and the processing function of the processing circuitry 15 are implemented by the single processing circuitry; however, embodiments are not limited to this. For example, the processing circuitries may be configured by combining multiple independent processors and each of the processors may execute each program to implement each processing function. Alternatively, the processing functions of the respective processing circuitries may be properly dispersed or integrated into a single or multiple processing circuitries and and implemented.

Figure 3:
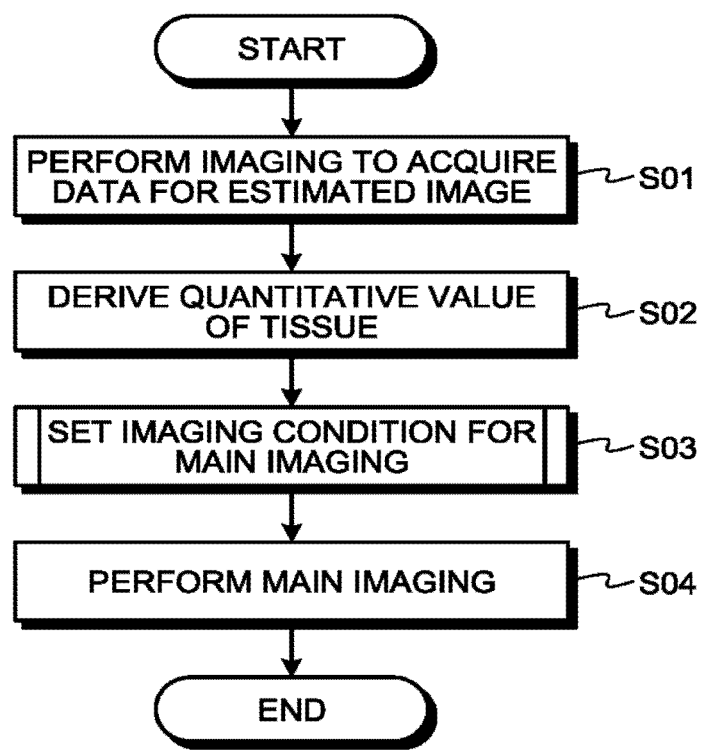
FIG. 3 is a flowchart of a procedure of a process performed by an MRI apparatus according to the first embodiment.

FIG. 3 is a flowchart of a procedure of a process performed by the MRI apparatus 100 according to the first embodiment. For example, as illustrated in FIG. 3, in the MRI apparatus 100 according to the first embodiment, first of all, the first imaging function 15a performs imaging to acquire multiple sets of data for estimated image 240 (step S01). The multiple sets of data for estimated image 240 are sets of data on the same area of a subject and are acquired by using multiple TIs and TEs.

For example, when the acquired data for estimated image 240 is used only for setting imaging parameters of the main imaging to be performed later, the first imaging function 51a may perform imaging with a reduced matrix size, a reduced number of slices, and a reduced number of acquisitions. In other words, in this case, the first imaging function 15a performs imaging to acquire images having a resolution lower than that of images to be acquired by performing the main imaging. This makes it possible to shorten the imaging time.

The tissue quantitative value calculating function 210 that the deriving function 14a includes then calculates a quantitative value of tissue of each pixel on the basis of the data for estimated image 240 acquired by the first imaging function 15a (step S02). For example, the tissue quantitative value calculating function 210 calculates values, such as T1, T2 and PD of tissues, and B1 field strength of each pixel. Depending on the data acquiring method for imaging performed by the first imaging function 15a, the tissue quantitative value calculating function 210 may calculate, for example, a value of a relaxation time referred to as $T2^*$, $T1\rho$ or $T2\rho$ or ADC.

The display control function 15b then sets an imaging condition for the main imaging (step S03). For example, the main imaging is acquisition of images to be used for actual diagnosing and, compared to imaging to acquire data for estimated image, the main imaging makes it possible to acquire images having a high spatial resolution, three-dimensional images (volume data) having a large number of slices, images having a high SN ratio because of an increase in the number of acquisitions, and images of a combination of those images. The process of setting the imaging condition for the main imaging will be described in detail below with reference to FIG. 4.

After the imaging condition for the main imaging is set, the second imaging function 15c executes the main imaging according to the set imaging condition (step S04). The second imaging function 15c transmits the pulse sequence execution data 290 that is generated by the display control function 15b to the processing circuitry 13 to execute the pulse sequence of the main imaging.

Step S01 among the above-described steps is, for example, implemented by the processing circuitry 15 by calling a given program corresponding to the first imaging function 15a from the storage circuitry 11 and executing the program. Step S02 is, for example, implemented by the processing circuitry 14 by calling a given program corresponding to the deriving function 14a from the storage circuitry 11 and executing the program. Step S03 is, for example, implemented by the processing circuitry 15 by calling a given program corresponding to the display control function 15b from the storage circuitry 11 and executing the program. Step S04 for example, implemented by the processing circuitry 15 by calling a given program corresponding to the second imaging function 15c from the storage circuitry 11 and executing the program.

Figure 4:
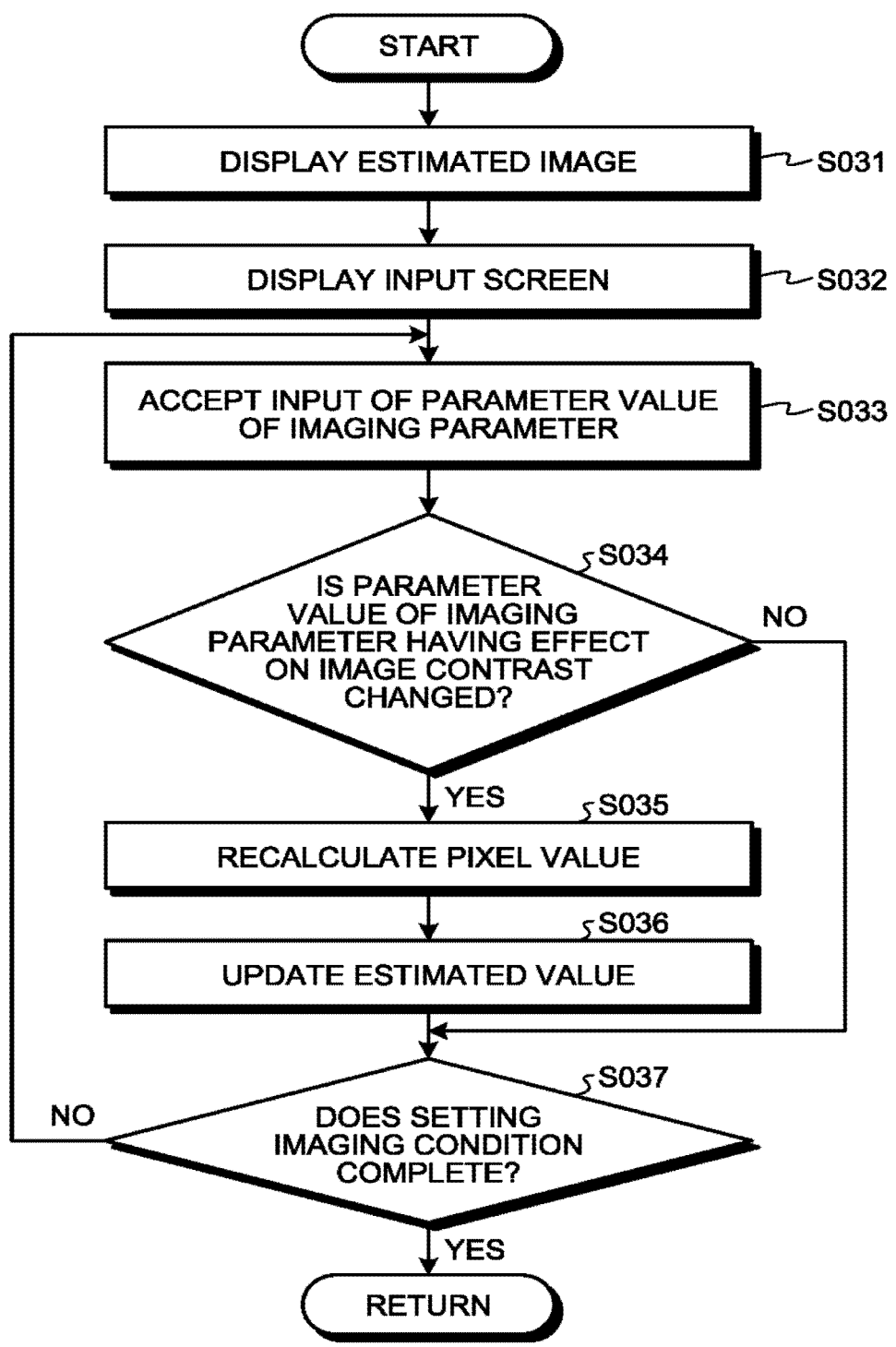
FIG. 4 is a flowchart of a procedure of the process of setting an imaging condition for main imaging illustrated in FIG. 3.

FIG. 4 is a flowchart of a procedure of a process of setting an imaging condition for the main imaging illustrated in FIG. 3. The procedure illustrated in FIG. 4 is executed at the step S03 represented in FIG. 3 by the imaging condition limit calculating function 220 and the pixel value calculating function 230 that the display control function 15b includes. Each step described here is, for example, implemented by the processing circuitry 15 by calling a given program corresponding to the display control function 15b from the storage circuitry 11 and executing the program.

For example, as illustrated in FIG. 4, in the process of setting an imaging condition for the main imaging, first of all, the pixel value calculating function 233 creates, through a calculation, an estimated image of the subject on the basis of the quantitative value of tissue that is calculated by the tissue quantitative value calculating function 210, the pulse sequence timing 250 of the main imaging, and the imaging parameter 260 having an effect on the contrast and displays the created estimated image on the display 10 (step S031).

The imaging condition limit calculating function 220 displays, on the display 10, an input screen that accepts an input of a parameter value of an imaging parameter together with the estimated image (step S032). The imaging condition limit calculating function 220 then accepts an input of a parameter value of an imaging parameter from an operator (step S033).

Figure 5:
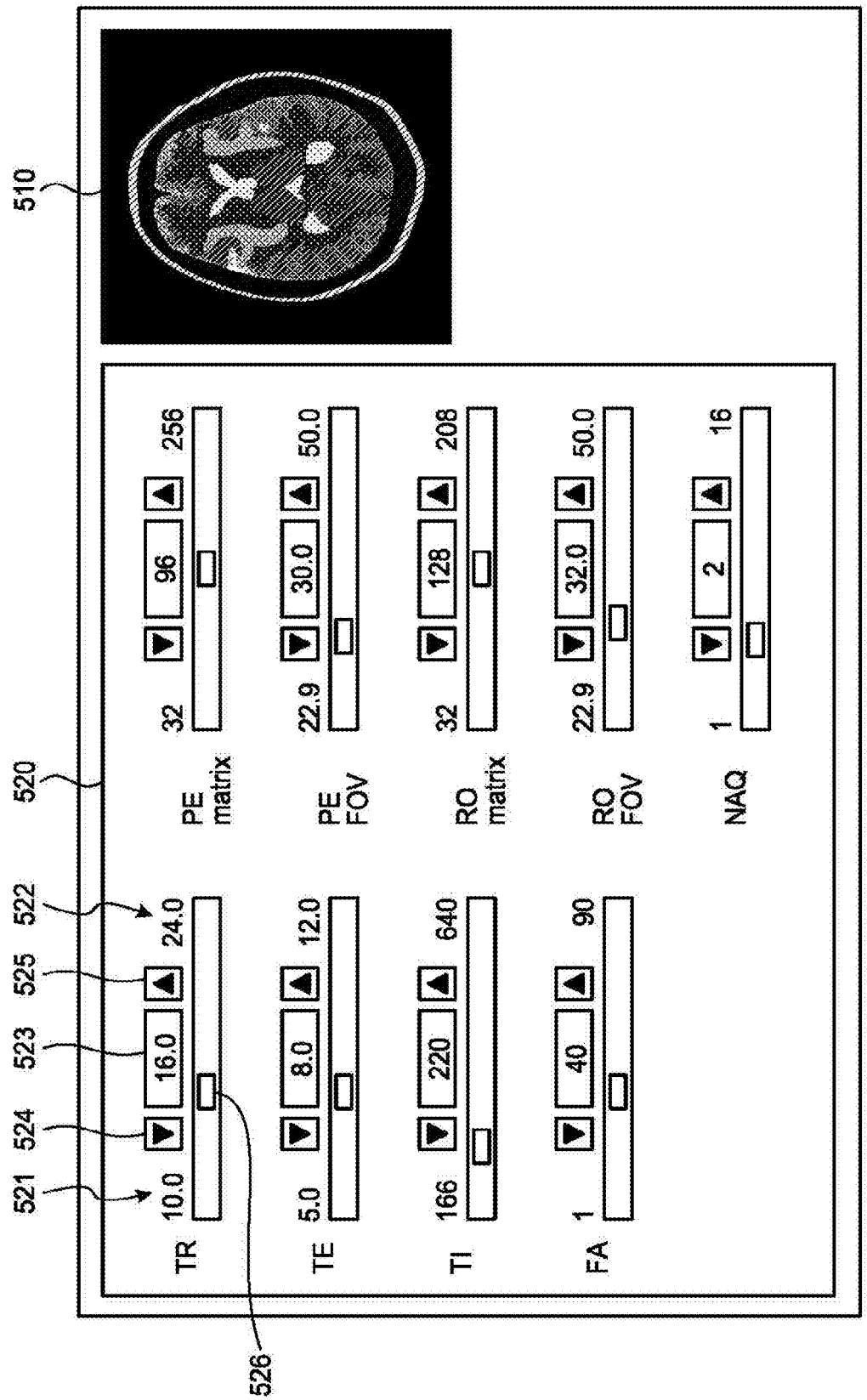
FIG. 5 is a diagram of an exemplary estimated image and an exemplary input screen that are displayed by a display control function according to the first embodiment.

FIG. 5 is a diagram of an exemplary estimated image 510 and an exemplary input screen 520 that are displayed by the display control function 15b according to the first embodiment. For example, as illustrated in FIG. 5, the pixel value calculating function 230 displays the generated estimated image 510 and the imaging condition limit calculating function 220 displays the input screen 520 side by side with the estimated image 510. The imaging condition limit calculating function 220 displays imaging parameters having effects on the contrast and imaging parameters having no effect on the contrast on the input screen 520 and accepts inputs of parameter values of the respective parameters.

For example, as illustrated in in FIG. 5, TR, TE, TI and FA that are the imaging parameters having effects on the contrast are displayed to be lined vertically on the left on the input screen 520. On the right on the input screen 520, for example, a matrix size in the phase encoding direction (PE matrix), the field of view in the phase encoding direction (PE FOV), and a matrix size in the read-out direction, and the number of acquisitions (NAQ) that are imaging parameters having no effect on the contrast are displayed to be lined vertically. The imaging parameters illustrated in FIG. 5 are examples only. Imaging parameters other than the exemplified imaging parameters may be displayed on the input screen 520.

For example, on the input screen 520, a lower limit 521 and an upper limit 522 that depend on the mutual effect with the performance of the apparatus and other imaging parameter are displayed with respect to each imaging parameter value. For example, with respect to TR, 10.0 ([msec]) is displayed as the lower limit 521 and 24.0 ([msec]) is displayed as the upper limit 522.

Furthermore, on the input screen 520, a GUI for inputting a parameter value is displayed with respect to each imaging parameter. For example, a text box 523 for the operator to directly input a numerical value of a parameter value by using, for example, a keyboard is displayed. Furthermore, for example, a down-pointing arrow button 524, an a up-pointing arrow button 525, and a slider 526 for the operator to change the numerical value of the parameter value by using, for example, a mouse are displayed. The down-pointing arrow button 524 is for reducing the numerical value of the parameter value and the up-pointing arrow button 525 is for increasing the numerical value of the parameter value. The slider 526 is moved leftward to reduce the numerical value of the parameter value and is moved rightward to increase the numerical value of the parameter value. In the example illustrated in FIG. 5, the 16 ([msec]) is set as a parameter value in the text box 523 of TR. The operator is able to change the set parameter value by inputting a numerical value in the text box 523 or pressing any one of the arrow buttons 524 and 525 or moving the slider leftward and rightward.

FIG. 4 will be referred back here. When the operator changes the parameter value of an imaging parameter having no effect on the image contrast (NO at step S034), the tissue quantitative value calculating function 210 determines whether setting an imaging condition completes (step S037).

On the other hand, when the operator changes the parameter value of an imaging parameter having an effect on the image contrast (YES at step S034), the pixel value calculating function 230 recalculates the pixel values on the basis of the quantitative value of tissue, which is calculated by the tissue quantitative value calculating function 210, the pulse sequence timing 250 of the main imaging, and the imaging parameter 260 having an effect on the contrast after the change (step S035). The pixel value calculating function 230 then updates the displayed estimated image 510 on the basis of the pixel values obtained from the recalculation (step S036). The tissue quantitative value calculating function 210 then determines whether setting an imaging condition completes (step S037).

The operator is able to determine whether images to be obtained by performing the main imaging has a contrast suitable to diagnose the lesion by observing the estimated image 510 displayed on the display 10. When the image has a desired contrast, the operator inputs an instruction indicating that setting an imaging condition completes via the input circuitry 9.

Until the operator inputs the instruction indicating that setting an imaging condition completes (NO at step S037), the imaging condition limit calculating function 220 and the pixel value calculating function 230 repeat the process from step S033 to S036. Accordingly, a change in the imaging parameter made by the operator, calculation of pixel values, and display of an estimated image are performed sequentially. Accordingly, when the operator changes the parameter value of an imaging parameter on the input screen, the operator is able to observe the estimated image 510 resulting from the change approximately in real time.

When the operator inputs the instruction indicating that setting an imaging condition completes (YES at step S307), the imaging condition limit calculating function 220 ends the process of setting an imaging condition for the main imaging. Here, the imaging condition limit calculating function 220 generates the pulse sequence execution data 290 on the basis of the set parameter value of the imaging parameter.

As described above, the MRI apparatus 100 according to the first embodiment acquires in advance data for creating an estimated image in order to acquire a high-resolution image or a three-dimensional image having a contrast proper to depict a lesion of a subject to be examined. For example, in editing an imaging condition for, for example, three-dimensional imaging, when the operator changes an imaging parameter, such as TR, TE, TI or FA, having an effect on the image contrast, the MRI apparatus 100 calculates and displays an estimated image of the subject corresponding to the imaging parameter by using the T1 value and the T2 value of tissue obtained in the imaging for creating an estimated image and the imaging parameters of the pulse sequence. At the same time, the MRI apparatus 100 calculates, for example, a timing of three-dimensional imaging, an gradient magnetic field strength, an RF field strength, a SAR, and db/dt, checks whether it is possible to implement the three-dimensional sequence within the performance of the hardware, safety and the limits of imaging parameters, and completes editing the imaging condition for three-dimensional imaging at the time when a desired contrast is achieved with reference to the image.

According to the first embodiment described above, it is possible to properly set imaging parameters having an effect on the image contrast such that a lesion is described more finely. Furthermore, it is possible to set an imaging condition for a high spatial resolution imaging and three-dimensional imaging enabling a contrast optimum to a lesion. Furthermore, it is possible to, prior to imaging, properly set imaging parameters enabling more fine depiction of a lesion. Furthermore, it is possible to optimally set an imaging condition for high-resolution imaging and three-dimensional imaging performed on, for example, a lesion regarding which an imaging condition enabling the finest depiction is not known unless the lesion is imaged or on the head of a child regarding which the optimum contrast is not known. Furthermore, it is possible to shorten the imaging time by performing, as imaging to acquire data for an estimated image, imaging to acquire images having a resolution lower than images to be acquired by performing the main imaging.

According to the first embodiment, it is thus possible to acquire more proper images according to a clinical condition.

It is possible to carry out the above-described first embodiment after modifying it partly. Some modifications of the above-described first embodiment will be described as second to fourth embodiments below. The MRI apparatuses according to the second to fourth embodiments have the same configuration as that illustrated in FIG. 1 basically and have functions only partly different from those illustrated in FIG. 1. For this reason, the components having the same functions as those described with respect to the first embodiment will be denoted with the same reference numerals as those of the first embodiment and descriptions thereof will be omitted and functions different from those of the first embodiment will be described mainly.

Second Embodiment

The above-described first embodiment exemplifies the case where the display control function 15b displays an estimated image that is generated on the basis of quantitative values of tissues on the display 10; however, embodiments are not limited to this. For example, the display control function 15b may accept specifying a region of interest (ROI) on an estimated image. The modification will be described as the second embodiment below.

According to the second embodiment, the display control function 15b accepts specifying an ROI on an estimated image. The display control function 15b also derives a possible value of a parameter value of an imaging parameter that is set for main imaging such that the pixel value of the specified ROI is a desired value, such as the maximum value or the minimum value. The display control function 15b displays the derived possible value as an input value of the parameter value of the imaging parameter on the input screen.

Figure 6:
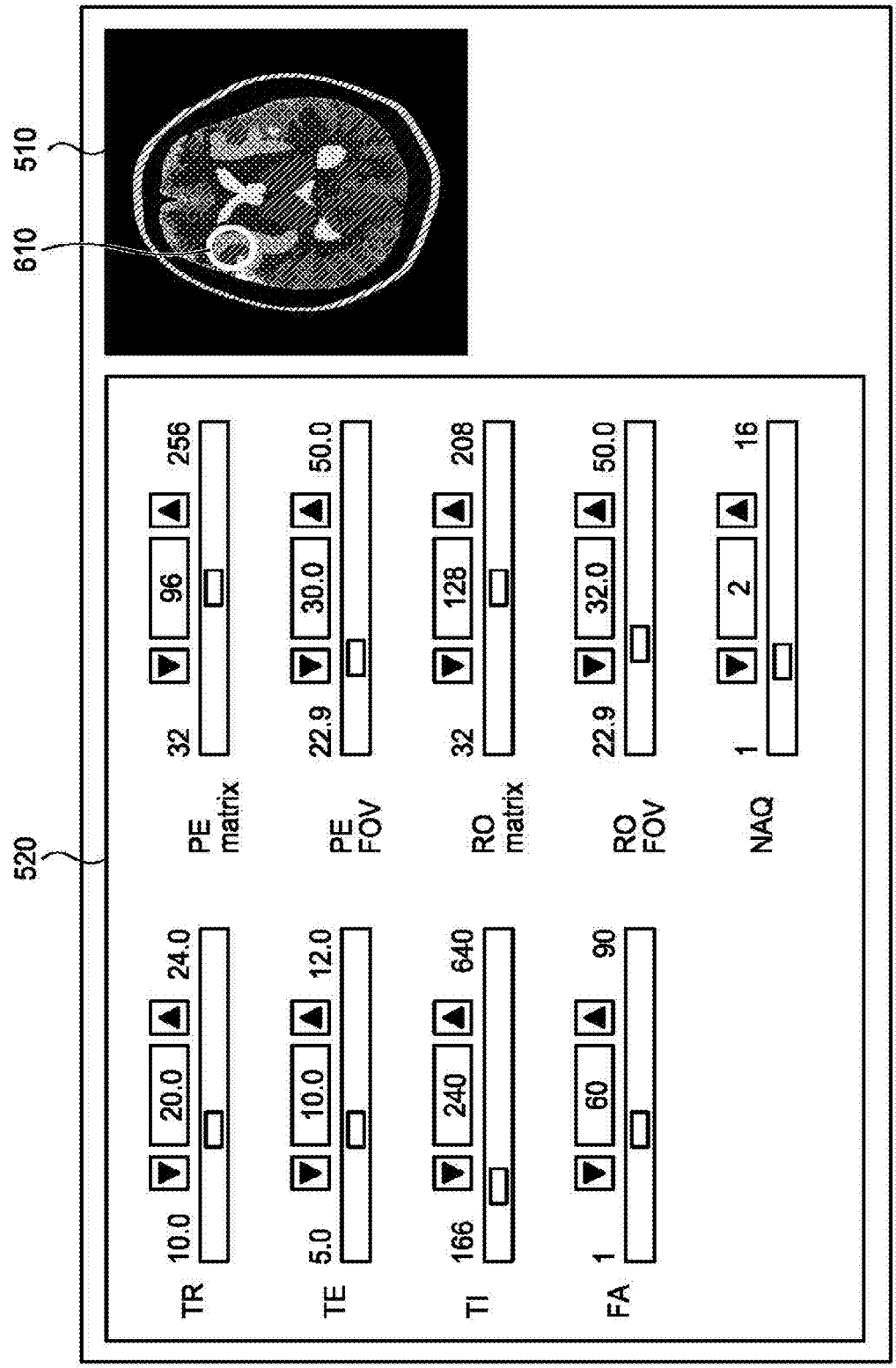
FIG. 6 is a diagram of an exemplary estimated image and an exemplary input screen that are displayed by a display control function according to a second embodiment.

FIG. 6 is a diagram of the exemplary estimated image 510 and the exemplary input screen 520 that are displayed by the display control function 15b according to the second embodiment. For example, as illustrated in FIG. 6, according to the second embodiment, as in the first embodiment, the pixel value calculating function 230 displays the generated estimated image 510 and the imaging condition limit calculating function 220 displays the input screen 520 side by side with the estimated image 510.

In the second embodiment, the imaging condition limit calculating function 220 accepts specifying a ROI 610 on the estimated image 510 that is displayed on the display 10 from an operator via the input circuitry 9. The operator is able to specify the ROI 610 in a desired size in a desired position on the estimated image 510. In the example illustrated in FIG. 6, the circular ROI 610 is represented; however, the shape of the ROI 610 is not limited to this. The shape may be another one, such as the shape of rectangle or a rhombus.

By specifying the ROI 610 on the estimated image 510 displayed on the display 10 while observing the estimated image 510, the operator is able to specify a tissue regarding which the operator wants to improve the image contrast.

Once the operator specifies the ROI 610, the imaging condition limit calculating function 220 derives a possible value of a parameter value of an imaging parameter that is set for the main imaging such that the pixel value of the ROI 610 is a desired value, such as the maximum value or the minimum value.

By using, for example, a relaxation time that is calculated by the tissue quantitative value calculating function 210, the imaging condition limit calculating function 220 calculates a possible value of an imaging parameter having an effect on the contrast such that the image contrast in the ROI 610 improves. The imaging condition limit calculating function 220 then displays the calculated possible value as an input value of the parameter value of the imaging parameter on the input screen 520. Accordingly, the parameter value of the imaging parameter that is displayed on the input screen 520 is updated. Accordingly, the operator is able to know the parameter value of the imaging parameter to improve the contrast of the tissue specified by the ROI 610.

Once the imaging condition limit calculating function 220 calculates the possible value of the parameter value of the imaging parameter, the pixel value calculating function 230 updates, through a recalculation, the displayed estimated image 510 on the basis of the quantitative value of tissue calculated by the tissue quantitative value calculating function 210, the pulse sequence timing 250 of the main imaging, and the possible value that is calculated by the imaging condition limit calculating function 220. Accordingly, by observing the estimated image 510, the operator is able to know the state of the image to be obtained by performing the main imaging in a case where the contrast of the tissue specified by the ROI 610 is improved.

As described above, the MRI apparatus 100 according to the second embodiment accepts specifying a ROI on the estimated image and derives a possible value of the parameter value of the imaging parameter that is set for the main imaging to improve the image contrast in the specified ROI and displays the derived possible value as an input value of the parameter value of the imaging parameter on the input screen. This configuration enables the operator to acquire images in which a region of interest is depicted more finely by specifying the region of interest while observing the estimated image and specifying the specified region of interest as the ROI. For example, it is possible to employ the configuration to set the pixel value of the cerebrospinal fluid at the lowest value in imaging, such as fluid attenuated inversion recovery (FLAIR).

According to the second embodiment, it is thus possible to acquire more proper images according to a clinical condition.

Third Embodiment

The above-described second embodiment exemplifies the case where the single ROI is specified on the estimated image; however, embodiments are not limited to this. For example, the display control function 15b may accept specifying multiple ROIs on an estimated image. The modification will be described as a third embodiment below.

In the third embodiment, the display control function 15b accepts specifying a first ROI and a second ROI on an estimated image. The display control function 15b derives a possible value of a parameter value of an imaging parameter that is set for main imaging such that the image contrast improves between the specified first ROI and second ROI.

FIG. 7 is a diagram of the exemplary estimated image 510 and the exemplary input screen 520 that are displayed by the display control function 15b according to the third embodiment. For example, as illustrated in FIG. 7, in the third embodiment, as in the first and second embodiments, the pixel value calculating function 230 displays the generated estimated image 510 and the imaging condition limit calculating function 220 displays the input screen 520 side by side with the estimated image 510.

In the third embodiment, the imaging condition limit calculating function 220 accepts specifying a ROI 710 and a ROI 720 on the estimated image 510 that is displayed on the display 10 from an operator via the input circuitry 9. The operator is able to specify the ROI 710 and the ROI 720 in preferable sizes in preferable positions on the estimated image 510. In the example illustrated in FIG. 7, the circular ROIs 710 and 720 are represented; however, the shape of the ROIs 710 and 720 is not limited to this. The shape may be another one, such as the shape of a rectangle or a rhombus.

By specifying the ROI 710 on the estimated image 510 displayed on the display 10 while observing the estimated image 510, the operator is able to specify a lesion regarding which the operator wants to improve the image contrast. Furthermore, by specifying the other ROI 720 on the estimated image 510, the operator is able to specify a region regarding which the operator wants to increase the difference in the pixel value from the region of interest specified by the ROI 710.

Once the operator specified the ROIs 710 and 720, the imaging condition limit calculating function 220 derives a possible value of a parameter value of an imaging parameter that is set for the main imaging such that the difference in pixel value between the region specified by the ROI 710 and the region specified by the ROI 720 is larger than a given value.

By using, for example, a relaxation time that is calculated by the tissue quantitative value calculating function 210, the imaging condition limit calculating function 220 calculates a possible value of an imaging parameter having an effect on the contrast such that the difference in pixel value between the region specified by the ROI 710 and the region specified by the ROI 720 is larger than the given value. The imaging condition limit calculating function 220 then displays the calculated possible value as an input value of the parameter value of the imaging parameter on the input screen 520. Accordingly, the parameter value of the imaging parameter that is displayed on the input screen 520 is updated. Accordingly, the operator is able to know the parameter value of the imaging parameter to improve the image contrast between the region specified by the ROT 710 and the region specified by the ROI 720.

Once the imaging condition limit calculating function 220 calculates a possible value of the parameter value of the imaging parameter, the pixel value calculating function 230 updates, through a recalculation, the displayed estimated image 510 on the basis of the quantitative value of tissue calculated by the tissue quantitative value calculating function 210, the pulse sequence timing 250 of the main imaging, and the possible value that is calculated by the imaging condition limit calculating function 220. Accordingly, by observing the estimated image 510, the operator is able to know the state of the image to be obtained by performing the main imaging in a case where the contrast is improved between the region specified by the ROI 710 and the region specified by the ROI 720.

As described above, the MRI apparatus 100 according to the third embodiment accepts specifying a first ROI and second ROI on an estimated image and derives a possible value of a parameter value of an imaging parameter that is set for the main imaging to improve the image contrast between the first ROI and the second ROI that are specified. This configuration allows the operator to specify a lesion with the first ROI and specify, with the second ROI, a region regarding which the operator wants to increase the difference in pixel value from the lesion and thus, by performing the main imaging, acquire images in which the lesion is weighted more than a certain region.

According to the third embodiment, it is thus possible to acquire more proper images according to a clinical condition.

Fourth Embodiment

The above-described first embodiment exemplifies the case where the single set of imaging is performed as the main imaging; however, embodiments are not limited to this. For example, when one subject is examined, multiple sets of imaging may be performed according to respective units referred to as protocols in one examination. In such a case, the process of setting an imaging condition for the main imaging may be performed according to each protocol. The modification will be described as the fourth embodiment below.

For example, the multiple protocols performed in one examination are classified into protocols that are included in the pre-scanning and protocols that are included in the main scanning. The pre-scanning includes, for example, a protocol for acquiring a sensitivity map representing a sensitivity distribution of the receiver coil, a protocol for acquiring data for shimming, and a protocol for acquiring positioning images for positioning images acquired by performing the main imaging. The main imaging includes, with respect to examination of, for example, the heart, a protocol for acquiring cine images, a protocol for imaging the velocity of the blood flow, a protocol for acquiring perfusion images by using contrast agent, a protocol for acquiring delayed enhancement images, and a protocol for imaging coronary arteries running over the heart.

For example, the MRI apparatus 100 manages the protocol group consisting of the series of multiple protocols that are performed in an examination according to a region to be imaged and the purpose of imaging. Specifically, the MEI apparatus 100 stores, with respect to each of the protocols that the protocol group includes, information that defines a pulse sequence used for each protocol in the storage circuitry 11. The information that defines a pulse sequence contains a pulse sequence timing that is described with respect to the first embodiment, an imaging parameter having an effect on the contrast, and an imaging parameter having no effect on the contrast. As in the first embodiment, defaults of these types of information are set in advance.

FIG. 8 is a flowchart of a procedure of a process performed by the MRI apparatus 100 according to the fourth embodiment. For example, as illustrated in FIG. 8, in the MRI apparatus 100 according to the fourth embodiment, the display control function 15b sets multiple protocols that are executed in an examination (step S11). For example, the display control function 15b displays a list of a protocol group that is managed in advance on the display 10 and accepts choices from the protocol group from an operator, thereby setting multiple protocols. The set multiple protocols includes a protocol for pre-scanning and a protocol for main imaging.

The first imaging function 15a then performs the pre-scanning (step S12). Here, when the pre-scanning includes multiple protocols, the first imaging function 15a executes the protocols sequentially.

The first imaging function 15a then performs imaging to acquire the multiple sets of data for estimated image 240 (step S13). For example, as in the first embodiment, the first imaging function 15a acquires the multiple sets of data for estimated image 240 by using multiple TIs and multiple TEs.

The tissue quantitative value calculating function 210 that the deriving function 14a includes then calculates a quantitative value of tissue of each pixel on the basis of the data for estimated image 240 acquired by the first imaging function 15a (step S14). For example, as in the first embodiment, the tissue quantitative value calculating function 210 calculates values, such as T1, T2, PD, T2*, T1ρ, T2ρ or ADC of tissues and B1 field strength as the quantitative value.

The display control function 15b then sets an imaging condition for the main imaging (step S15). Here, for example, the main imaging includes multiple protocols. The process of setting an imaging condition for the main imaging to be performed here will be described in detail below with reference to FIG. 9.

After the imaging condition for the main imaging is set, the second imaging function 15c executes the main imaging according to the set imaging condition (step S16). The second imaging function 15c transmits the pulse sequence execution data 290 that is generated by the display control function 15b with respect to each of the protocols to the processing circuitry 14 sequentially to execute the multiple protocols that the main imaging includes.

FIG. 8 exemplifies the case where the pre-scanning, the imaging to acquire the multiple sets of data for estimated image 240, and the main imaging are performed sequentially; however, embodiments are not limited to this. For example, the pre-scanning may include imaging to acquire multiple sets of data for estimated image 240 as one protocol or the main imaging may include the imaging at the beginning.

Steps S12 and S13 among the above-described steps are, for example, implemented by the processing circuitry 15 by calling a given program corresponding to the first imaging function 15a from the storage circuitry 11 and executing the program. Step S14 is, for example, implemented by the processing circuitry 14 by calling a given program corresponding to the deriving function 14a from the storage circuitry 11 and executing the program. Steps S11 and S15 are, for example, implemented by the processing circuitry 15 by calling a given program corresponding to the display control function 15b from the storage circuitry 11 and executing the program. Step S16 is, for example, implemented by the processing circuitry 15 by calling a given program corresponding to the second imaging function 15c from the storage circuitry 11 and executing the program.

FIG. 9 is a flowchart of a procedure of a process of setting an imaging condition for main imaging illustrated in FIG. 8. The procedure illustrated in FIG. 9 is executed at step S15 illustrated in FIG. 8 by the imaging condition limit calculating function 220 and the pixel value calculating function 230 that the display control function 15b includes. Each step described here is, for example, implemented by the processing circuitry 15 by calling a given program corresponding to the display control function 15b from the storage circuitry 11 and executing the program.

For example, as illustrated in FIG. 9, in the process of setting an imaging condition for the main imaging, first of all, the pixel value calculating function 230 creates, through a calculation, an estimated image of a subject on the basis of a quantitative value of tissue that is calculated by the tissue quantitative value calculating function 210, the pulse sequence timing 250 regarding one protocol that the main imaging includes, and the imaging parameter 260 having an effect on the contrast and displays the created estimated image on the display 10 (step S151).

The imaging condition limit calculating function 220 displays, on the display 10, an input screen that accepts an input of a parameter value of an imaging parameter regarding the protocol together with the estimated image (step S152). For example, the imaging condition limit calculating function 220 displays the same input screen as the input screen 520 illustrated in FIG. 5. The imaging condition limit calculating function 220 then accepts an input of a parameter value of an imaging parameter from the operator (step S153).

When the operator changes the parameter value of an imaging parameter having no effect on the image contrast (NO at step S154), the tissue quantitative value calculating function 210 determines whether setting an imaging condition regarding the protocol completes (step S157).

On the other hand, when the operator changes the parameter value of an imaging parameter having an effect on the image contrast (YES at step S154), the pixel value calculating function 230 recalculates the pixel values on the basis of the quantitative value of tissue that is calculated by the tissue quantitative value calculating function 210, the pulse sequence timing 250 of the main imaging, and the imaging parameter 260 having an effect on the contrast after the change (step S155). The pixel value calculating function 230 then updates the displayed estimated image 510 on the basis of the pixel values obtained from the re-calculation (step S156). The tissue quantitative value calculating function 210 then determines whether setting an imaging condition regarding the protocol completes (step S157).

As in the first embodiment, the operator is able to determine whether images obtained by performing the main imaging has a contrast suitable to diagnose the lesion by observing the estimated image 510 displayed on the display 10. When the estimated image 510 has a desired contrast, the operator inputs an instruction indicating that setting an imaging condition regarding the protocol completes via the input circuitry 9.

Until the operator inputs the instruction indicating that setting an imaging condition completes (NO at step S157), the imaging condition limit calculating function 220 and the pixel value calculating function 230 repeats the process from step S153 to S156. Accordingly, regarding the protocol, a change in the imaging parameter made by the operator, calculation of pixel values, and display of an estimated image are performed sequentially. Accordingly, when the operator changes the parameter value of an imaging parameter on the input screen, the operator is able to observe the estimated image 510 resulting from the change approximately in real time.

When the operator inputs the instruction indicating that setting an imaging condition completes (YES at step S157), the imaging condition limit calculating function 220 ends the process of setting an imaging condition for the main imaging regarding the protocol and determines whether setting an imaging condition completes with respect to all the protocols (step S158).

When setting an imaging condition does not complete with respect to all the protocols (NO at step S158), the pixel value calculating function 230 creates, through a calculation, an estimated image of the subject on the basis of the quantitative value of tissue that is calculated by the tissue quantitative value calculating function 210, the pulse sequence timing 250 regarding the next protocol that the main imaging includes, and the imaging parameter 260 having an effect on the contrast and displays the created estimated image on the display 10 (step S151). Furthermore, the imaging condition limit calculating function 220 displays, on the display 10, an input screen that accepts an input of a parameter value of an imaging parameter regarding the next protocol that the main imaging includes together with the estimated image (step S152). The imaging condition limit calculating function 220 and the pixel value calculating function 230 then perform the above-described process from step S153 to step S157.

Until setting an imaging condition completes with respect to all the protocols (NO at step S158), the imaging condition limit calculating function 220 and the pixel value calculating function 230 repeat the above-described process from step S151 to S157 while changing the protocol to be processed sequentially. When setting an imaging condition completes with respect to all the protocols (YES at step S158), the imaging condition limit calculating function 220 ends the process of setting an imaging condition for the main imaging. The imaging condition limit calculating function 220 generates the pulse sequence execution data 290 with respect to the multiple protocols that the main imaging includes on the basis of the set parameter value of the imaging parameter.

As described above, when the main imaging includes multiple protocols, the MRI apparatus 100 according to the fourth embodiment performs the process of setting an imaging condition for the main imaging with respect to each of the protocols. This configuration allows the operator to acquire images in which a lesion is depicted finely with respect to each of the multiple protocols that are executed in the main imaging.

According to the fourth embodiment, it is thus possible to acquire a more suitable image according to a clinical condition.

Each of the above-described embodiments represents a method of acquiring multiple sets of image data obtained by performing imaging while changing an imaging parameter having an effect on the contrast as imaging to acquire multiple sets of data for estimated image 240; however, embodiments are not limited to this. For example, as imaging in which a quantitative value of tissue is calculated, a method referred to as MR fingerprinting may be used in which data is acquired while the imaging parameters are changed partly at random in each repetition, the data sequence is compared by using a database prepared in advance and pattern recognition, and a quantitative value is estimated from the closest data (see, for example, Dan Ma et al., "Magnetic resonance fingerprinting", Nature, 495, 7440, 187-192, 2013).

The first to fourth embodiments have been described above. The word "processor" used in each of the embodiments refers to a circuitry, such as, a central processing unit (CPU), a graphics processing unit (GPU), an application specific integrated circuit (ASIC), a programmable logic device (such as a simple programmable logic device (SPLD)), a complex programmable logic device (CPLD), or a field programmable gate array (FPGA). Instead of saving the program in the storage circuitry, the program may be configured to be directly incorporated in the circuitry of the processor. In this case, the processor implements functions by reading the program incorporated in the circuitry and executing the program. Furthermore, the processors of the embodiments are not limited to a case where each of the processors is configured as a single circuitry. Multiple independent circuitries may be combined to configure a single processor to implement the functions.

According to at least one of the above-described embodiments, it is possible to acquire a more proper image according to a clinical condition.

While certain embodiments have been described, these embodiments have been presented by way of example only, and are not intended to limit the scope of the inventions. Indeed, the novel embodiments described herein may be, embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising: processing circuitry configured to
   perform first magnetic resonance imaging to acquire multiple magnetic resonance signals that are used to derive a quantitative value of tissue;
   derive the quantitative value of tissue based on the multiple magnetic resonance signals;
   display, on a display, an input screen to accept inputs of parameter values of a plurality of imaging parameters to be used for second magnetic resonance imaging different from the first magnetic resonance imaging, the imaging parameters being classified into a first imaging parameter that has an effect on a contrast of an image to be acquired by performing the second magnetic resonance imaging and a second imaging parameter that has no effect on the contrast of the image;
   generate an estimated image based on the derived quantitative value of the tissue and the input parameter values;
   display, on the display, the estimated image together with the input screen and, when one of the input parameter values of the first imaging parameter that has the effect on the contrast of the image is changed, update the estimated image through a recalculation; and
   acquire the image by performing the second magnetic resonance imaging based on the accepted parameter values.

2. The magnetic resonance imaging apparatus according to claim 1, wherein the processing circuitry is further configured to limit a range for at least one of the input parameter values of the imaging parameters that are displayed on the input screen.

3. The magnetic resonance imaging apparatus according to claim 2, wherein the processing circuitry is further configured to limit the range for the at least one of the input parameter values according to at least any one of the performance of the apparatus, a subject, and another imaging parameter.

4. The magnetic resonance imaging apparatus according to claim 1, wherein the processing circuitry is further configured to accept specifying a region of interest on the estimated image.

5. The magnetic resonance imaging apparatus according to claim 4, wherein the processing circuitry is further configured to derive a possible value of at least one of the parameter values of the imaging parameters that are set for the second imaging such that the pixel value of the region of interest is a desired value.

6. The magnetic resonance imaging apparatus according to claim 5, wherein the processing circuitry is further configured to display the derived possible value as an input value of the at least one of the parameter values.

7. The magnetic resonance imaging apparatus according to claim 1, wherein the processing circuitry is further configured to accept specifying a first region of interest and a second region of interest on the estimated image, and derive a possible value of at least one of the parameter values of the imaging parameters that are set for the second imaging such that the contrast of the image improves between the first region of interest and the second region of interest.

8. The magnetic resonance imaging apparatus according to claim 1, wherein the processing circuitry is further configured to perform, as the first imaging, imaging to acquire an image having a resolution lower than that of an image to be acquired by performing the second imaging.

9. The magnetic resonance imaging apparatus according to claim 1, wherein the quantitative value of tissue is a value of any one of a longitudinal relaxation time, a transverse relaxation time, a proton density, an apparent diffusion coefficient, T2*, T1$\rho$ and T2$\rho$ of tissue, and a radio frequency magnetic field strength.

10. The magnetic resonance imaging apparatus of claim 1, wherein the processing circuitry is further configured to update the estimated image through the recalculation, only when the one of the input parameter values of the first imaging parameter that has the effect on the contrast of the image is changed.

* * * * *